United States Patent
Green et al.

(10) Patent No.: US 6,819,125 B1
(45) Date of Patent: Nov. 16, 2004

(54) METHOD AND APPARATUS FOR INTEGRATED CIRCUIT FAILURE ANALYSIS

(75) Inventors: James E. Green, Nampa, ID (US); Nicholas E. Paulin, Nampa, ID (US); Justin R. Arrington, Boise, ID (US); Michael D. Kenney, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/625,450

(22) Filed: Jul. 23, 2003

(51) Int. Cl.$^7$ .................... G01R 31/302; G01R 1/04
(52) U.S. Cl. .................... 324/750; 324/158.1
(58) Field of Search .................... 324/750, 756, 324/758, 760, 765, 158.1; 438/14–19; 250/306–307; 29/846

(56) References Cited

U.S. PATENT DOCUMENTS

| | | | |
|---|---|---|---|
| 4,629,898 A | * 12/1986 | Orloff et al. ............. | 324/158.1 |
| 5,159,752 A | * 11/1992 | Mahant-Shetti et al. ..... | 324/765 |
| 5,304,924 A | * 4/1994 | Yamano et al. ............. | 324/758 |
| 5,523,694 A | * 6/1996 | Cole, Jr. ................... | 324/158.1 |
| 5,612,491 A | * 3/1997 | Lindsay ...................... | 73/105 |
| 5,844,416 A | * 12/1998 | Campbell et al. ........... | 324/750 |
| 5,959,458 A | * 9/1999 | Talbot ........................ | 324/750 |
| 6,091,248 A | * 7/2000 | Hellemans et al. ......... | 324/756 |
| 6,377,066 B1 | * 4/2002 | Bridges et al. ............. | 324/765 |
| 6,549,022 B1 | * 4/2003 | Cole et al. .................. | 324/765 |

* cited by examiner

*Primary Examiner*—David A. Zarneke
*Assistant Examiner*—Jermele Hollington
(74) *Attorney, Agent, or Firm*—Williams, Morgan & Amerson

(57) ABSTRACT

The present invention provides a method and apparatus for detecting and locating a fault in an integrated circuit structure formed in one or more insulating layers deployed on a semiconductor substrate. The apparatus includes a probe tool capable of detecting a fault in the integrated circuit structure, a laser tool capable of forming an electrical connection between the integrated circuit structure and the semiconductor substrate, and a controller coupled to the probe tool and the laser tool, wherein the controller is capable of directing the laser tool to form the electrical connection between the integrated circuit structure and the semiconductor substrate in response to detecting the fault in the integrated circuit structure. The apparatus also includes a source for providing an electrical charge to the integrated circuit structure in response to detecting the fault in the integrated circuit structure and a detector for detecting an electrical charge accumulation in at least a portion of the integrated circuit structure.

30 Claims, 6 Drawing Sheets

METHOD AND APPARATUS FOR INTEGRATED CIRCUIT FAILURE ANALYSIS

BACKGROUND OF THE INVENTION

1. Field of the Invention

This invention relates generally to integrated circuit devices, and, more particularly, to a method for detecting faulty structures in integrated circuit devices.

2. Description of the Related Art

Automated semiconductor fabrication processes allow millions of integrated circuit structures to be formed on a single semiconductor die. For example, individual transistors, complex memory arrays, processor devices, and other like circuits are commonly formed on semiconductor dice. Although the automated processes are reliable, they are not perfect. The integrated circuit structures formed by automated fabrication processes may contain a variety of faults, including electrical shorts, open circuits, and the like. The faults may cause the integrated circuit structures to operate in an undesirable manner or to fail entirely.

Structures and techniques have been developed to detect faults in integrated circuit structures formed on semiconductor dice. One example of such a structure and an associated technique is illustrated in FIGS. 1A–C. FIG. 1A shows a plan view of a first exemplary integrated circuit structure 100 including a plurality of circuit elements 110 and at least two pads 120(1–2). A cross-sectional view of the integrated circuit structure 100 along the line 130 is shown in FIG. 1B. The circuit elements 110 and pads 120(1–2) are located in an insulating layer 140 and are electrically coupled by a plurality of vias 150. The insulating layer 140 also electrically isolates the circuit elements 110, the pads 120(1–2), and the vias 150 from a semiconductor substrate 160. As will be understood by those of ordinary skill in the art, the insulating layer 140 will typically comprise two or more insulating layers, with the circuit elements 100, the pads 120(1–2), and the vias 150 formed in the various insulating layers. Thus, FIG. 1B represents a simplified illustration of a structure 100.

A probe tool 170 may be electrically coupled to the pads 120(1–2). If no faults are present in the integrated circuit structure 100, the probe tool 170 will determine that the pad 120(1) is electrically coupled to the pad 120(2). However, if a fault, such as the open circuit 180 shown in FIG. 1C, is present, the probe tool 170 will determine that the pad 120(1) is not electrically coupled to the pad 120(2). Although the probe tool 170 may detect the presence of the open circuit 180, the probe tool cannot typically determine a location of the open circuit 180.

A second example of a structure and an associated technique for determining faults is illustrated. in FIGS. 2A–C. FIG. 2A shows a plan view of second exemplary integrated circuit structure 200 including a plurality of circuit elements 210 and at least two pads 220(1–2). A cross-sectional view of the integrated circuit structure 200 along the line 230 is shown in FIG. 2B. The circuit elements 210 and pads 220(1–2) are located in an insulating layer 240 and are electrically coupled by a plurality of vias 250. In the second exemplary integrated circuit structure 200, a via 255 electrically couples the pad 220(1) to a semiconductor substrate 260, which is typically coupled to an electrical ground potential 265 during testing. As in the case of the insulating layer 140 shown in FIG. 1B, the insulating layer 240 in FIG. 2B will typically comprise two or more insulating layers, with the integrated circuit structure 200 being formed in the two or more insulating layers.

In the second failure analysis technique, a scanning electron microscope (SEM) 270 irradiates the integrated circuit structure with an electron beam 275. Electrons (not shown) from the beam are deposited in the circuit elements 210, the pads 220(1–2), and the vias 250, 255. If there are no faults in the integrated circuit structure 110, the electrons flow along the integrated circuit structure 100, through the via 255 to the electrical ground potential 265. Thus, the integrated circuit structure 200 discharges to a reduced electrical charge or, in some cases, becomes electrically neutral. If a fault, such as the open circuit 280 shown in FIG. 2C, is present, electrons in a first portion of the integrated circuit structure 200 between the via 255 and the open circuit 280 flow to the ground potential 265, and this portion of the structure 200 is essentially discharged. The open circuit 280 electrically decouples the second portion of the integrated circuit structure 200, located between the open circuit 280 and the pad 220(2) and shown with shading in FIG. 2C, from the ground potential 265. Consequently, the flow of electric charge out of the second portion is reduced, or stopped, by the open circuit 280, and the second portion retains an electric charge for a longer time than the first portion.

The electric charge retained in the second portion of the integrated circuit structure 200 can be detected using known voltage contrasting techniques. Consequently, the location of the open circuit 280 may be determined using the second failure analysis technique. However, to determine if a fault exists in a structure (or a set of structures) the entire structure (or set of structures) must be scanned. This process of scanning is time consuming and costly. Moreover, the structure 200 is not readily susceptible to testing using the probe 170 of FIG. 1C because the structure 200 is grounded (through the via 255 and the substrate 260).

Conversely, the structure 100 is easily tested using the probe 170, but it cannot be analyzed using the SEM 270 and voltage contrasting techniques because no point of the structure is grounded. Hence, a technique has been developed whereby the structure 100, after testing by the probe 170 to determine the existence of a fault somewhere in the structure, may be altered to render it susceptible to analysis using the SEM 270. The technique involves boring or etching an opening through one of the pads 120(1–2), through the insulating layer 140, and to the substrate 160. This opening is then filled with a conductive material so as to electrically couple the selected pad to the substrate 160. Thereafter, the structure 100 may be analyzed in much the same way as the structure 200 of FIGS. 2A–C.

SUMMARY OF THE INVENTION

In one aspect of the instant invention, an apparatus is provided for detecting and locating a fault in an integrated circuit structure formed in one or more insulating layers deployed on a semiconductor substrate. The apparatus includes a probe tool capable of detecting a fault in the integrated circuit structure, a laser tool capable of forming an electrical connection between the integrated circuit structure and the semiconductor substrate, and a controller coupled to the probe tool and the laser tool, wherein the controller is capable of directing the laser tool to form the electrical connection between the integrated circuit structure and the semiconductor substrate in response to detecting the fault in the integrated circuit structure. The apparatus also includes a source for providing an electrical charge to the integrated circuit structure in response to detecting the fault in the integrated circuit structure and a detector for detecting an electrical charge accumulation in at least a portion of the integrated circuit structure.

In another aspect of the present invention, a method is provided for detecting and locating faults in an integrated circuit structure formed on a substrate. The method includes probing the integrated circuit structure to determine if a fault exists in the integrated circuit structure using a probe tool, forming an electrical connection between the integrated circuit structure and the substrate using a laser tool, and determining a location of the fault in the integrated circuit structure using a scanning electron microscope.

BRIEF DESCRIPTION OF THE DRAWINGS

The invention may be understood by reference to the following description taken in conjunction with the accompanying drawings, in which like reference numerals identify like elements, and in which.

Figure 1A:
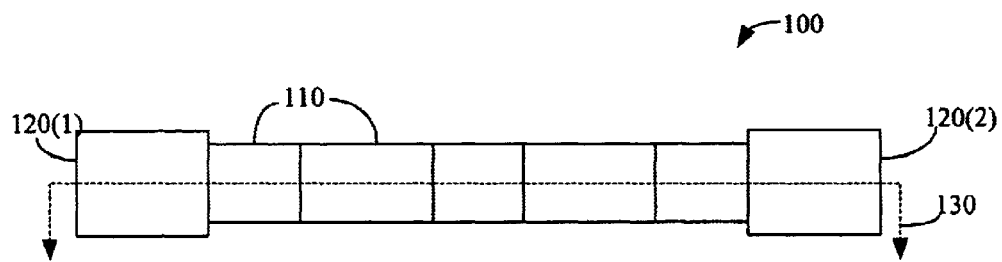
FIGS. 1A–C show a first prior art structure and analysis technique for probing a first exemplary integrated circuit structure.
Figure 1B:
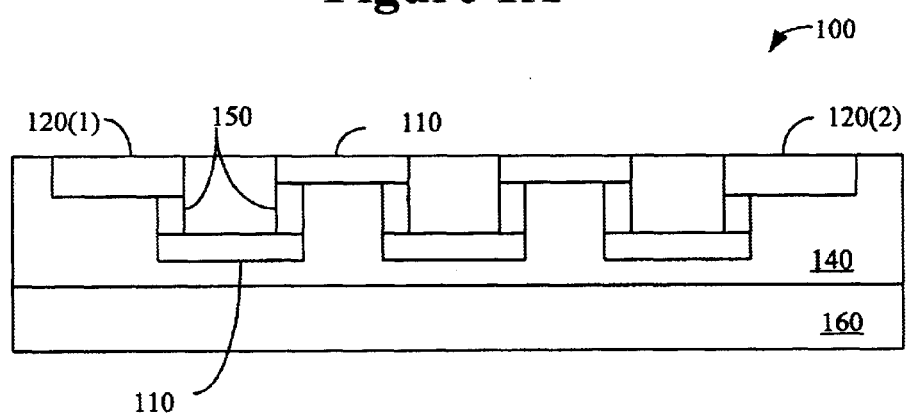
Figure 1C:
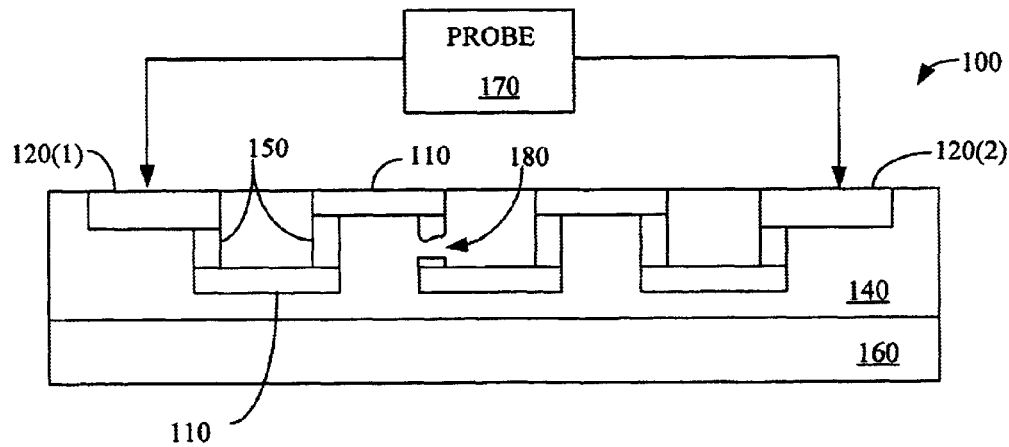
Figure 2A:
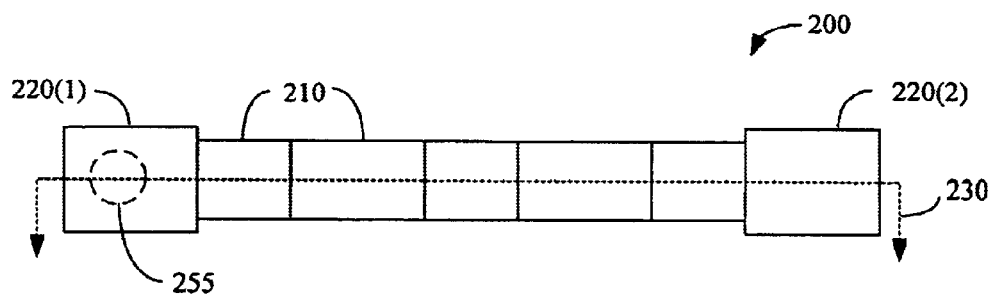
FIGS. 2A–C show a second prior art structure and analysis technique for scanning a second exemplary integrated circuit structure.
Figure 2B:
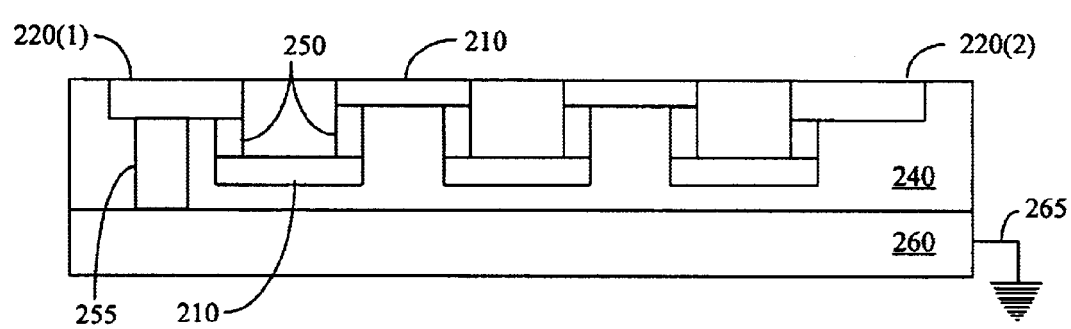
Figure 2C:
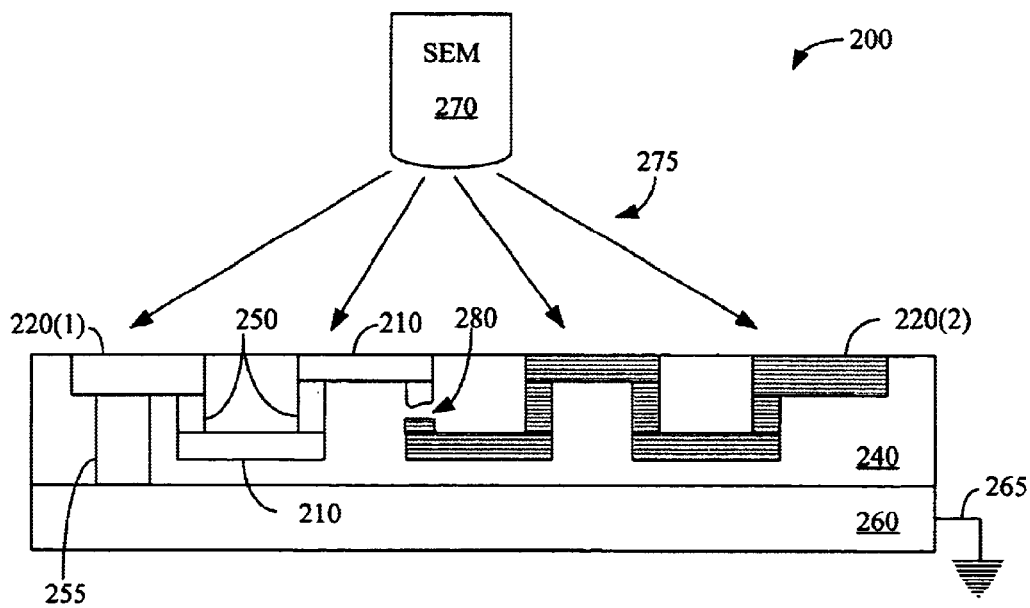

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 3:
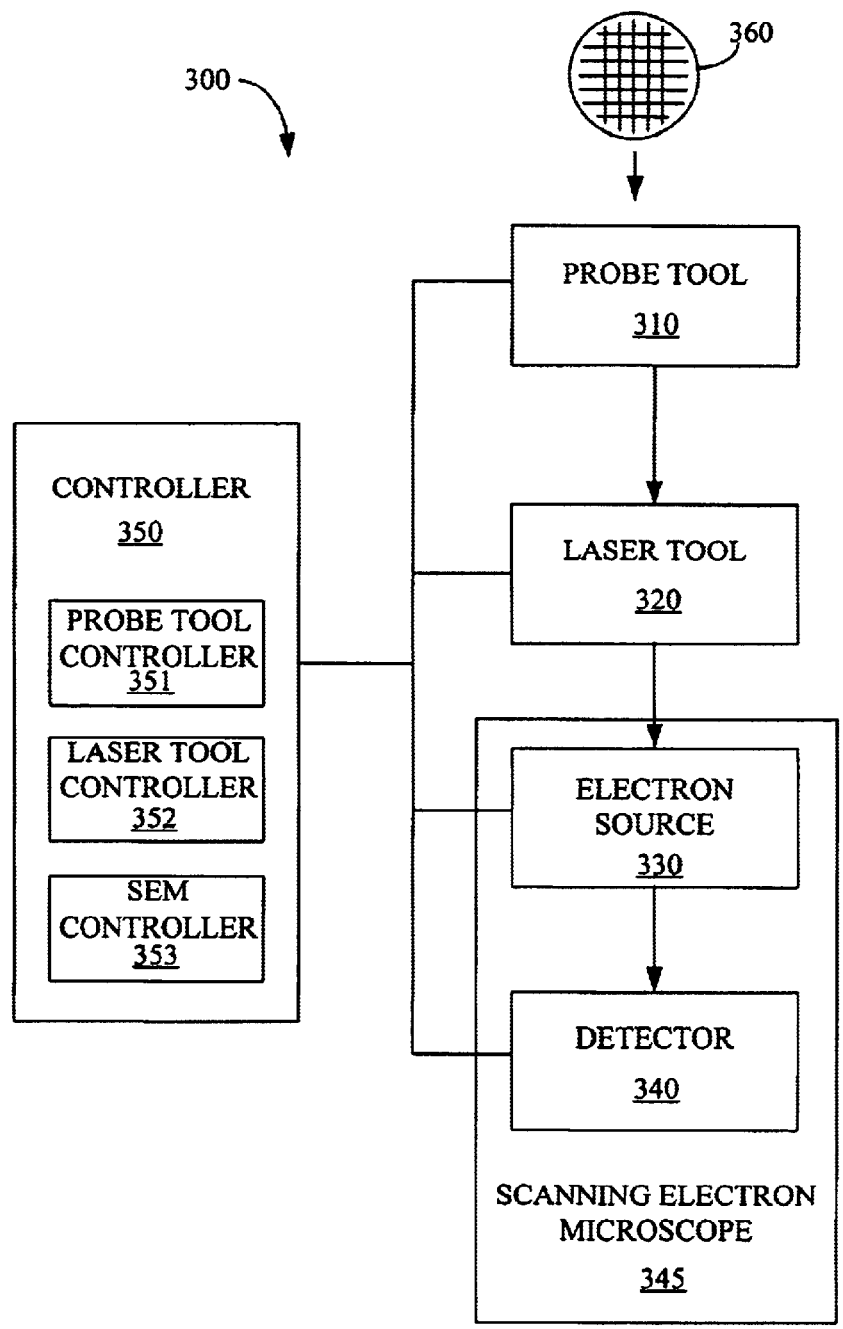
FIG. 3 shows a system for failure analysis, in accordance with one embodiment of the present invention.

Referring now to FIG. 3, a failure analysis system 300 is shown. In one embodiment, the failure analysis system 300 includes a probe tool 310, a laser tool 320, an electron source 330, a detector 340, and a controller 350. In various embodiments, the electron source 330 and detector 340 may be separate devices or they may be combined in a single apparatus, such as a scanning electron microscope 345. However, it will be appreciated that the present invention is not limited to specific tools or apparatus. Additional components not shown in FIG. 3 may be included in the failure analysis system 300 without departing from the scope of the present invention. Furthermore, although the probe tool 310, the laser tool 320, the electron source 330, the detector 340, and the controller 350 are depicted as separate elements in FIG. 3, the present invention is not so limited. For example, in one embodiment, the failure analysis system 300 may be constructed such that one or more of the probe tool 310, the laser tool 320, the electron source 330, the detector 340, and the controller 350 may be incorporated into a single device. In an alternative embodiment, one or more of the probe tool 310, the laser tool 320, the electron source 330, the detector 340, and the controller 350 may be deployed as a larger number of separate devices. For another example, the controller 350 may be deployed as a plurality of components, including a probe tool controller 351, a laser tool controller 352, a scanning electron microscope controller 353, and the like.

The probe tool 310, the laser tool 320, the electron source 330, and the detector 340 are each capable of receiving a semiconductor wafer 360. A variety of integrated circuit structures (e.g. the integrated circuit structure 400 shown in FIG. 4A) may be formed on the semiconductor wafer 360 using processes known to those of ordinary skill in the art. As will be described in more detail below, and in accordance with one embodiment of the present invention, the integrated circuit structures formed on the semiconductor wafer 360 may be probed by the probe tool 310 to determine whether or not a fault is present in the integrated circuit structure. If a fault is detected, the probe tool 310 provides a location of the faulty integrated circuit structure to the controller 350. For example, if a fault is detected in the integrated circuit structure 400 shown in FIG. 4A, the probe tool 310 may provide coordinates indicating the location of the pad 415(1) to the controller 350.

The controller 350 may then use the coordinates provided by the probe tool 310 to instruct the laser tool 320 to electrically couple the faulty integrated circuit structure to a ground potential. For example, if a fault is detected in the integrated circuit structure 400 shown in FIG. 4A, the controller 350 may instruct the laser tool 320 to direct a beam of light onto a portion of the pad 415(1) to electrically couple the pad 415(1) to the ground potential, as described in detail below.

Once the faulty integrated circuit structure is electrically coupled to the ground potential, the controller 350 may instructs the electron source 330 to irradiate the faulty integrated circuit structure with electrons, enabling the detector 340 to determine the location of the fault in the faulty integrated circuit structure. For example, the electron source 330 and detector 340 may be combined in a single scanning electron microscope, which may irradiate the faulty integrated circuit structure with electrons and determine the location of the fault in the faulty integrated circuit structure using voltage contrasting techniques, as described in detail below.

By using the failure analysis system 300, the time and expense of locating faults in integrated circuit structures can be reduced. For example, in one embodiment, faults in integrated circuit structures on a wafer the located in approximately 1.5 hours using the failure analysis system 300. In contrast, conventional methods may take up to three times longer and require specially designed structures. Consequently, errors in the semiconductor fabrication process that cause faults in the integrated circuit structures can be characterized more easily and accurately.

Figure 4A:
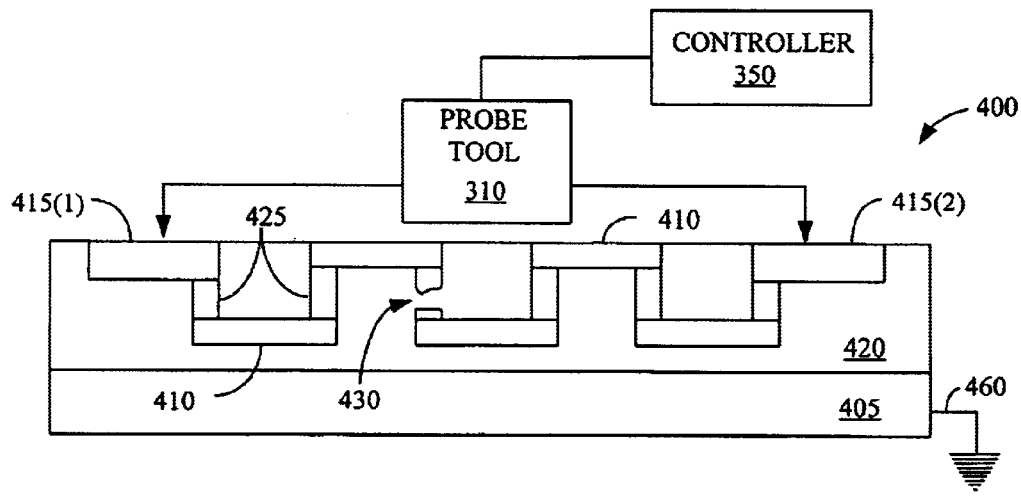
FIGS. 4A–C show aspects of a process for probing an integrated circuit structure and electrically coupling the integrated circuit structure to a semiconductor substrate, in accordance with one embodiment of the present invention.
Figure 4B:
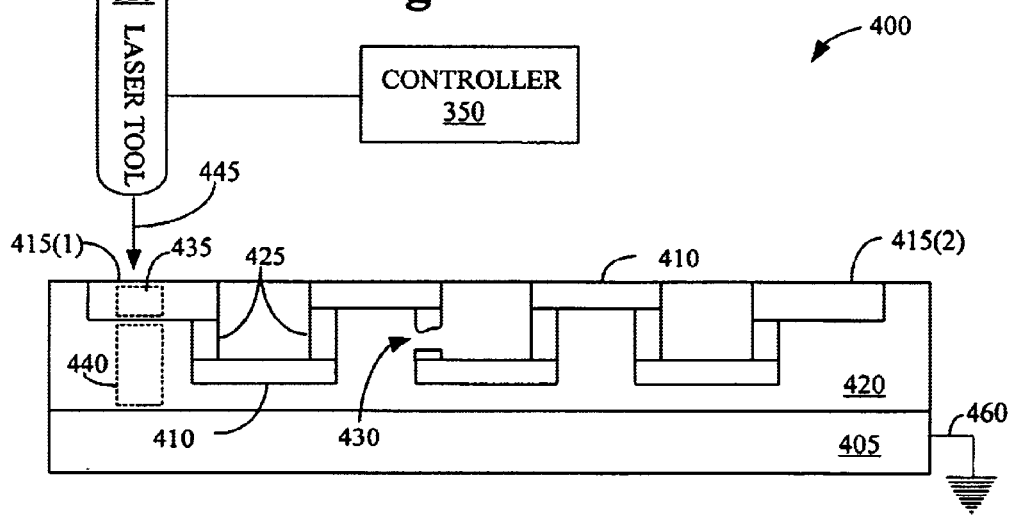
Figure 4C:
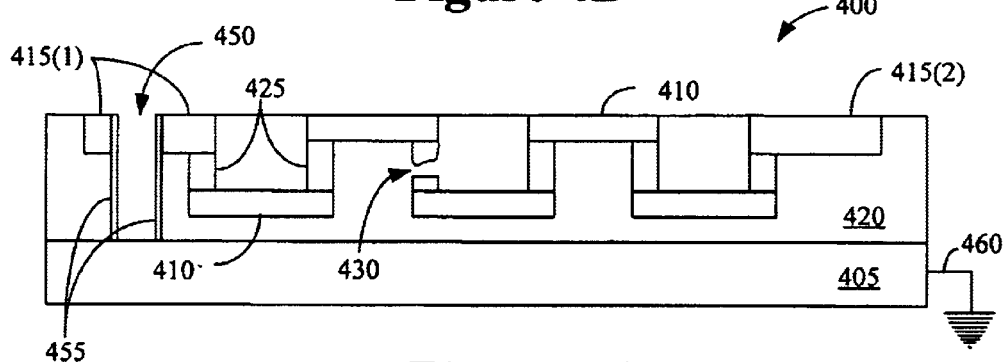

Referring now to FIGS. 4A–C, a process for probing an integrated circuit structure 400 and electrically coupling the integrated circuit structure 400 to a semiconductor substrate 405 is illustrated. A cross-sectional view of the integrated circuit structure 400 is shown in FIG. 4A. The integrated circuit structure 400 includes a plurality of circuit elements 410 and at least two pads 415(1–2). The circuit elements 410 and pads 415(1–2) are located in an insulating layer 420 and are electrically coupled by a plurality of vias 425. The insulating layer 420 is formed on the semiconductor substrate 405 and electrically isolates the circuit elements 410, pads 415(1–2), and vias 425 from the semiconductor substrate 405.

The probe tool 310 is electrically coupled to the pads 415(1–2). If no faults are present in the integrated circuit structure 400, the probe tool 310 will determine that the pad 415(1) is electrically coupled to the pad 415(2). However, if a fault, such as the open circuit 430 shown in FIG. 4A, is present, the probe tool 310 will determine that the pad 415(1) is not electrically coupled to the pad 415(2). Although the probe tool 310 may detect the presence of the open circuit 430, the probe tool 310 cannot typically determine a location of the open circuit 430.

The probe tool 310 then transmits a location of one of the pads, e.g. the pad 415(1), to the controller 350, which instructs the laser tool 320 to irradiate a portion 435 of the pad 415(1) and a portion 440 of the insulating layer 420 using a beam 445, as shown in FIG. 4B. By irradiating the portion 435 of the pad 415(1) and the portion 440 of the insulating layer 420, the laser tool 320 heats the portions 435, 440 and causes an opening 450 to form in the pad 415(1) and the insulating layer 420, as shown in FIG. 4C. For example, the laser tool 320 may blow the opening 450 into the pad 415(1) and the insulating layer 420 by irradiating the portions 435, 440.

The beam 445 from the laser tool 320 melts material from the portion 435 of the pad 415(1) and the portion 440 of the insulating layer 420. Some of the melted material remains in the opening 450 and forms an electrical connection 455 that electrically couples the pad 415(1) to the semiconductor substrate 405. In one embodiment, the semiconductor substrate 405 is coupled to a ground potential 460. Thus, the electrical connection 455 may be formed without using costly and time consuming processes such as etching, depositing, planarizing, and the like. In addition, the electrical connection 455 may be formed only in integrated circuit structures 400 that have first been determined to contain faults using the probe tool 310.

Figure 5A:
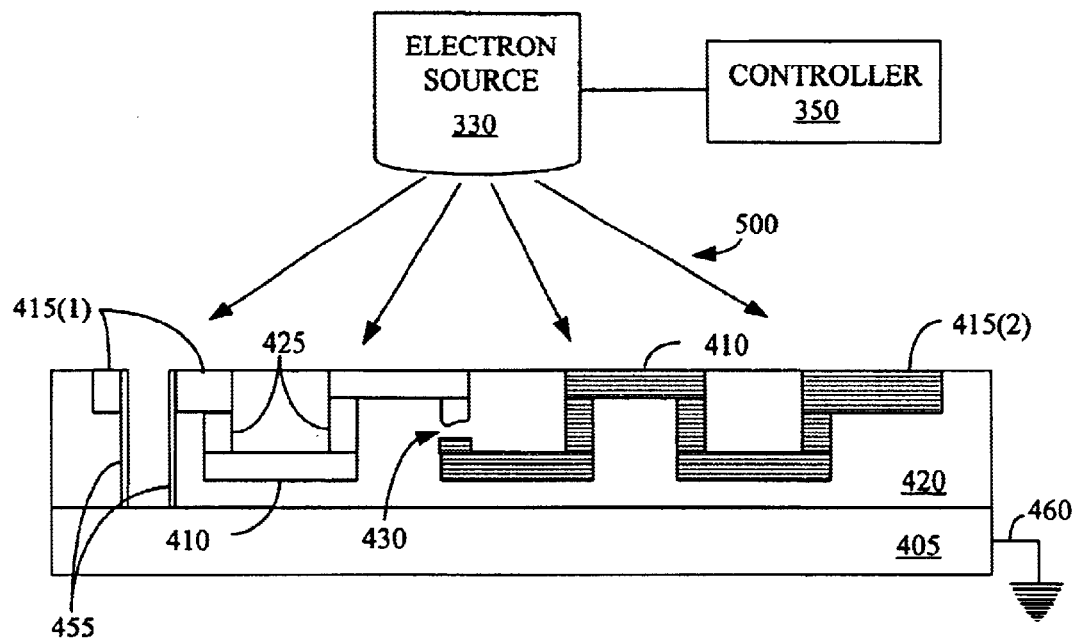
FIGS. 5A–B show aspects of a process for locating a fault in the integrated circuit structure shown in FIGS. 4A–C, in accordance with one embodiment of the present invention.
Figure 5B:
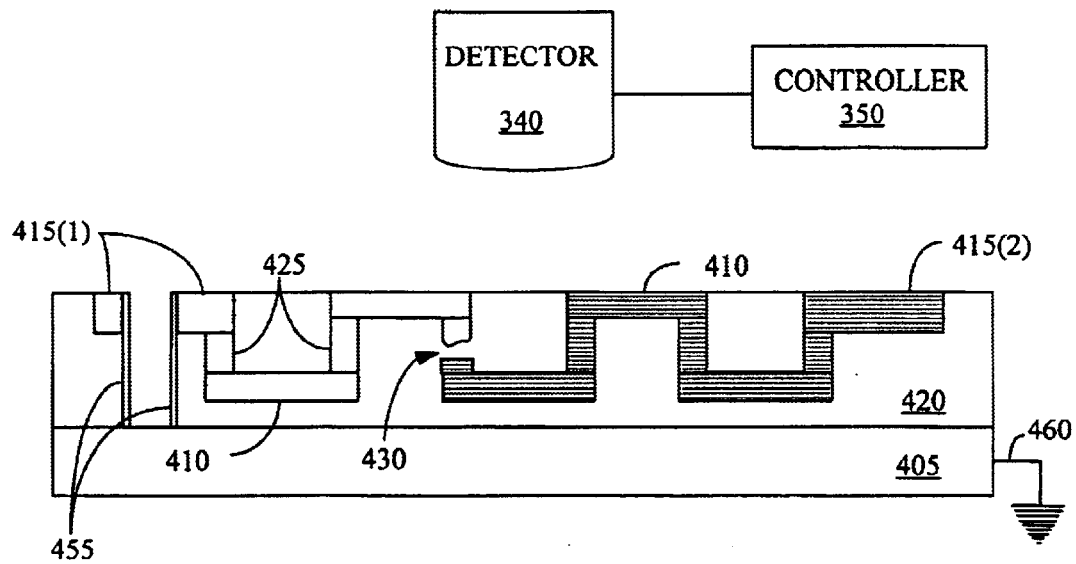

Referring now to FIGS. 5A–B, a process for locating the open circuit 430 in the integrated circuit structure 400 is shown. In one embodiment, the controller 350 instructs the electron source 330 to irradiate the integrated circuit structure 400 with an electron beam 500. For example, the electron source 330 may be a scanning electron microscope that irradiates the integrated circuit structure 400 with the electron beam 500. Electrons (not shown) from the electron beam 500 are deposited in at least the circuit elements 410, the pads 415(1–2), the vias 425, and the electrical connections 455. A first portion (unshaded in FIGS. 5A–B) of the integrated circuit structure 400 located between the electrical connection 455 and the open circuit 430 is electrically coupled to the ground potential 265 by the electrical connection 455. Thus, electrons in the first portion flow to the ground potential 265, effectively discharging the components in the first portion.

The open circuit 430 electrically decouples the electric ground potential 460 from a second portion (shaded in FIGS. 5A–B) of the integrated circuit structure 400 between the open circuit 430 and the pad 415(2). Electrons in the second portion flow more slowly, if at all, to the ground potential 460, causing the second portion to retain an electric charge for a longer time than the first portion. Consequently, the second portion retains a larger electric charge than the first portion.

Figure 6:
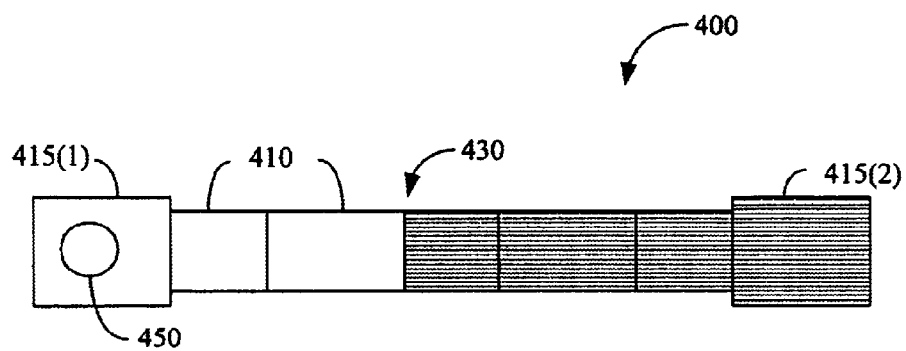
FIG. 6 shows a first exemplary fault in the integrated circuit structure illustrated in FIGS. 4A–C and 5A–B.
Figure 7:
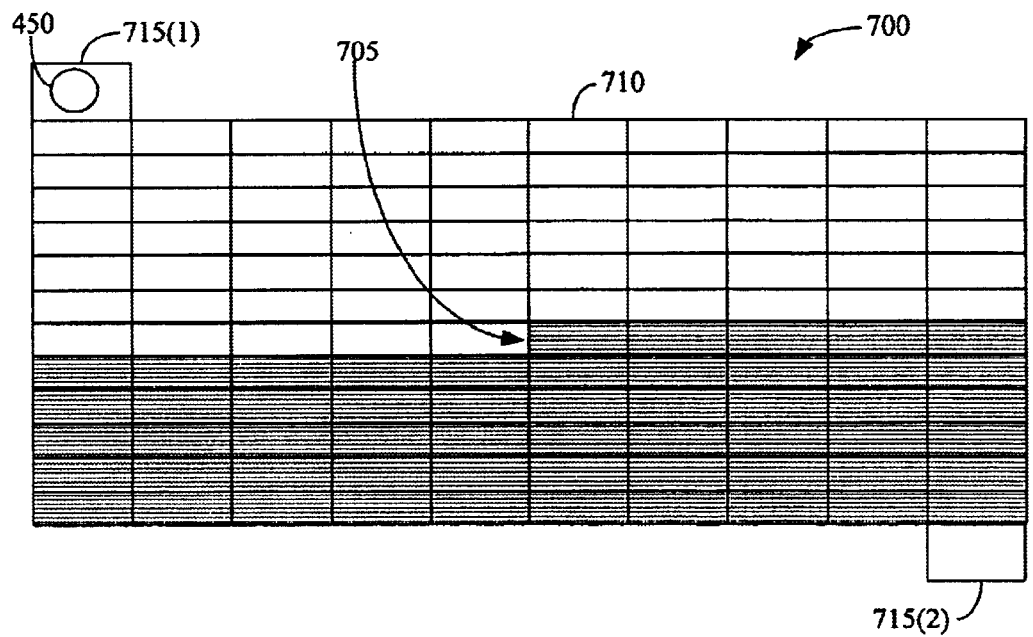
FIG. 7 shows a second exemplary fault located in a second integrated circuit structure.

The detector 340 detects the location of the open circuit 430 by detecting, directly or indirectly, the electric charge on the first and second portions. In one embodiment, the electric charge in the second portion of the integrated circuit structure 400 can be detected using known voltage contrasting techniques. That is, the difference in potentials on the first and second portions can be visually observed under the detector 340, enabling easy location of the fault 430. For example, FIG. 6 shows the location of the open circuit 430 depicted in the integrated circuit structure illustrated in FIGS. 4A–C and 5A–B. For a second example, FIG. 7 shows a second open circuit 705 located in a second integrated circuit structure 700. In the second example, the integrated circuit structure 700 is an array of elements 710 that may be coupled to each other and to a plurality of pads 715(1–2) by vias (not shown).

By using the failure analysis system 300 described above, the electron source 330 and the detector 340 may be used to determine the location of the open circuit 430 when the probe tool 310 has determined that the open circuit 430 is present in the integrated circuit structure 400. Thus, time consuming scanning steps may be taken only when it is determined that the integrated circuit structure 400 contains a fault such as the open circuit 430. This is particularly advantageous because only a small percentage of the integrated circuit structures 400 in a lot typically contain faults. Moreover, using the present invention, a structure may be employed that is susceptible to probe testing and easily alterable so as to be susceptible to scanning electron microscope analysis and voltage contrasting techniques.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified all such variations are considered within the scope and spirit of the invention. Accordingly, the protection sought herein is as set forth in the claims below.

What is claimed:

1. An apparatus for detecting and locating a fault in an integrated circuit structure formed in one or more insulating layers deployed on a semiconductor substrate, comprising:
   a probe tool capable of detecting a fault in the integrated circuit structure;
   a laser tool capable of forming an electrical connection between the integrated circuit structure and the semiconductor substrate;
   a controller coupled to the probe tool and the laser tool, wherein the controller is capable of directing the laser tool to form the electrical connection between the integrated circuit structure and the semiconductor substrate in response to detecting the fault in the integrated circuit structure;
   a source for providing an electrical charge to the integrated circuit structure in response to detecting the fault in the integrated circuit structure; and
   a detector for detecting an electrical charge accumulation in at least a portion of the integrated circuit structure.

2. The apparatus of claim 1, wherein the probe tool is capable of being coupled to at least two locations in the integrated circuit structure.

3. The apparatus of claim 2, wherein the at least two locations in the integrated circuit structure are at least two pads.

4. The apparatus of claim 1, wherein the laser tool is capable of forming the electrical connection between the integrated circuit structure and the substrate by melting a portion of the integrated circuit structure.

5. The apparatus of claim 4, wherein the portion of the integrated circuit structure is a pad.

6. The apparatus of claim 1, wherein the laser tool is capable of forming the electrical connection between the integrated circuit structure and the substrate by melting a portion of the one or more insulating layers.

7. The apparatus of claim 1, wherein the source for providing the electrical charge is a scanning electron microscope.

8. The apparatus of claim 1, wherein the integrated circuit structure is an array of circuit elements.

9. The method of claim 1, wherein the controller is capable of determining location coordinates of the probe tool and directing the laser tool to the determined location coordinates.

10. The method of claim 1, wherein the controller comprises a probe tool controller and a laser tool controller, the probe tool controller capable of providing location coordinates to the laser tool controller.

11. The apparatus of claim 1, wherein the controller is coupled to the source for providing the electrical charge, and wherein the controller is capable of directing the source to the integrated circuit structure.

12. The apparatus of claim 11, wherein the controller comprises an electrical charge source controller, a probe tool controller, and a laser tool controller.

13. The apparatus of claim 12, wherein the laser tool controller is capable of receiving location coordinates from the probe tool controller, and wherein the electrical charge source controller is capable of receiving location coordinates from at least one of the probe tool controller and the laser tool controller.

14. An apparatus for detecting and locating a fault in an integrated circuit structure formed in one or more insulating layers deployed on a semiconductor substrate, comprising:
   a probe tool capable of detecting a fault in the integrated circuit structure;
   a laser tool capable of forming an electrical connection between the integrated circuit structure and the semiconductor substrate;
   a scanning electron microscope; and
   a controller coupled to the probe tool, the laser tool, and the scanning electron microscope, wherein the controller is capable of directing the laser tool to form the electrical connection between the integrated circuit structure and the semiconductor substrate in response to detecting the fault in the integrated circuit structure, and wherein the scanning electron microscope is capable of providing an electrical charge to the integrated circuit structure and detecting an electrical charge accumulation in at least a portion of the integrated circuit structure in response to detecting the fault in the integrated circuit structure.

15. The apparatus of claim 14, wherein the controller comprises a probe tool controller capable of determining location coordinates of a pad in the integrated circuit structure.

16. The apparatus of claim 15, wherein the controller comprises a laser tool controller capable of receiving the determined location coordinates from the probe tool controller, and wherein the laser tool controller is capable of directing the laser tool to the determined location coordinates.

17. The apparatus of claim 16, wherein the controller comprises a scanning electron microscope controller capable of receiving the determined location coordinates from the probe tool controller or the laser tool controller, and wherein the scanning electron microscope controller is capable of directing the scanning electron microscope to the integrated circuit structure.

18. A method for detecting and locating faults in an integrated circuit structure formed on a substrate, comprising:
   probing the integrated circuit structure to determine if a fault exists in the integrated circuit structure using a probe tool;
   forming an electrical connection between the integrated circuit structure and the substrate using a laser tool;
   determining a location of the fault in the integrated circuit structure using a scanning electron microscope.

19. The method of claim 18, wherein probing the integrated circuit structure comprises coupling a probe to a plurality of pads in the integrated circuit structure.

20. The method of claim 18, wherein forming the electrical connection between the integrated circuit structure and the substrate using the laser tool comprises providing a location of the faulty integrated circuit structure to the laser tool.

21. The method of claim 20, wherein providing the location of the faulty integrated circuit structure to the laser tool comprises providing the location of a pad in the faulty integrated circuit structure to the laser tool.

22. The method of claim 21, wherein providing the location of a pad in the faulty integrated circuit structure to the laser tool comprises determining location coordinates of the probe tool and directing the laser tool to the location coordinates.

23. The method of claim 22, wherein forming the electrical connection between the integrated circuit structure and the substrate using the laser tool comprises forming the electrical connection between the integrated circuit structure and the substrate at the provided location coordinates.

24. The method of claim 23, wherein forming the electrical connection between the integrated circuit structure and the substrate at the provided location coordinates comprises melting a portion of the integrated circuit structure at the provided location coordinates using the laser tool.

25. The method of claim 24, wherein melting the portion of the integrated circuit structure at the provided location coordinates using the laser tool comprises irradiating the portion of the integrated circuit structure at the provided location coordinates using the laser tool.

26. The method of claim 18, wherein determining the location of the fault in the integrated circuit structure using the scanning electron microscope comprises providing a plurality of electrons to the integrated circuit structure using an electron beam from the scanning electron microscope.

27. The method of claim 18, wherein determining the location of the fault in the integrated circuit structure using the scanning electron microscope comprises detecting an electrical charge accumulation in a first portion of the integrated circuit structure.

28. The method of claim 18, wherein determining the location of the fault in the integrated circuit structure comprises applying a voltage contrasting technique to a first portion and a second portion of the integrated circuit structure.

29. The method of claim 18, wherein determining the location of the fault in the integrated circuit structure comprises providing location coordinates to a scanning electron microscope controller.

30. The method of claim 18, further comprising providing location coordinates of the probe tool to the laser tool and to the scanning electron microscope.

* * * * *